United States Patent [19]

O'Keefe et al.

[11] Patent Number: 5,628,882
[45] Date of Patent: May 13, 1997

[54] METHOD FOR SPUTTER DEPOSITION OF A CHROMIUM, CARBON AND FLUORINE CRYSTALLINE FILMS

[75] Inventors: Matthew J. O'Keefe, Kettering, Ohio; J. Michael Rigsbee, Hoover, Ala.

[73] Assignee: The United States of America as represented by the Secretary of the Air Force, Washington, D.C.

[21] Appl. No.: 391,430

[22] Filed: Feb. 17, 1995

[51] Int. Cl.$^6$ ............................................. C23C 14/10
[52] U.S. Cl. .................. 204/192.15; 204/192.26; 204/157.15; 427/446; 117/89; 117/92
[58] Field of Search .......................... 117/86, 89, 105, 117/108, 92; 204/192.29, 192.15; 427/446

[56] References Cited

U.S. PATENT DOCUMENTS

| | | | |
|---|---|---|---|
| 4,597,844 | 7/1986 | Hiraki et al. | 204/192 |
| 5,071,677 | 12/1991 | Patterson et al. | 427/249 |
| 5,135,808 | 8/1992 | Kimock et al. | 428/336 |
| 5,266,409 | 11/1993 | Schmidt et al. | 428/446 |

OTHER PUBLICATIONS

"Optical Properties and Microstructures of Gold–Fluorocarbon–Polymer Composite Films", Kay, et al., Phy. Rev. B, vol. 32, No. 2 (1985) pp. 719–732.
"Metal Clusters in Plasma Polymerized Matrices: Gold," Kay, et al., J. Appl. Phys. 55 (2) (15 Jan. 1984) pp. 370–374.
"Microstructure and Electrical Conductivity of Plasma Deposited Gold/Fluorocarbon Composite Films," Kay, et al., J. Vac. Sci. Tech. A4 (1) (Jan./Feb. 1986) 46.
"Metal Clusters in Plasma Polymerized Fluorocarbon Films: Cobalt–Aluminum", Kay, et al. J. Vac, Sci, Tech, A2 (2) (Apr. Jun. 1984) 401.
"Metal Doped Fluorocarbon Polymer Films Prepared by Plasma Polymerization Using an RF Planar Magnetron Target," Biederman, et al, Nucl. Inst. Meth. 212 (1983) 497.
"Use of X–Ray Photoelectron Spectroscopy to Study Bonding in Cr, Mn, Fe, and Co Compounds;" Carver, et al., J. Chem. Phys. 57 (2) (15 Jul. 1972) 973.
"Handbook of X–ray Photoelectron Spectroscopy," Muilenberg, ed (Perkin–Elmer Corp, 1992).
"Reactive Sputter Deposition of crystalline Cr/C/F thin films;" O'Keefe, et al; Matter. Lett. (1994), 18 (5–6), pp. 251–256.
O'Keefe et al, "Reactive Sputter Deposition of Crystalline Cr/C/F Thin Films", Materials Letters 18 (1994) pp. 251–256.

*Primary Examiner*—Felisa C. Garrett
*Attorney, Agent, or Firm*—Bobby D. Scearce; Thomas L. Kundert

[57] ABSTRACT

System and method for plasma-assisted deposition of optically transparent, crystalline chromium/carbon/fluorine films are described using a chromium metal source and an argon/fluorocarbon plasma. The films were optically transparent to the unaided eye. Characterization of the material by electron diffraction showed the chromium/carbon/fluorine material to be crystalline.

4 Claims, 4 Drawing Sheets

METHOD FOR SPUTTER DEPOSITION OF A CHROMIUM, CARBON AND FLUORINE CRYSTALLINE FILMS

RIGHTS OF THE GOVERNMENT

The invention described herein may be manufactured and used by or for the Government of the United States for all governmental purposes without the payment of any royalty.

BACKGROUND OF THE INVENTION

The present invention relates generally to systems and methods for depositing thin films, and more particularly to system and method for depositing optically transparent films of crystalline chromium/carbon/fluorine (Cr/C/F) material.

Conventional methods for plasma-assisted vacuum deposition of metal/polymer or metal/ organic thin films include co-sputtering of polymer/metal composite targets using inert or reactive glow discharges, plasma deposited organometallics, and simultaneous sputter deposition/ plasma polymerization. The properties of metal/polymer thin films are significantly influenced by chemical composition and microstructure; for example, Kay et al (*Phys. Rev.* B Vol.32 No.2 (15 Jul. 1985) 719–732; *J.Appl. Phys.* 55 (2) (15 Jan. 1984) 370; *J. Vac. Sci. Tech.* A4 (1) (Jan/Feb 1986) demonstrated the effect of incorporating gold into fluorocarbon matrices on electrical and optical properties of deposited films. Changes in electrical resistivity and optical transmission were correlated to and explained by the film microstructure.

Plasma-assisted processing of materials can lead to formation of compounds and structures not obtainable under equilibrium conditions. Chemical composition, crystal structure and physical, electrical and optical properties of plasma synthesized material may be significantly different from equilibrium processed material. For example, incorporating a reactive metal such as aluminum or cobalt into a fluorocarbon plasma polymerizing environment can significantly affect properties of the deposited film. Conductivity of aluminum/fluorine plasma deposited films changed 16 orders of magnitude above and below a critical fluorocarbon/argon gas mixture in the plasma (*J. Vac. Sci. Tech.* A2 (2) (Apr/Jun 1984 ). Analysis of the films revealed an insulating aluminum-fluorine compound and not a polymeric material; transmission electron microscopy (TEM) of plasma deposited cobalt/fluorine films showed fine particles of metallic Co, Co+$CoF_2$, and $CoF_2$ formed as fluorocarbon concentration in the plasma went from below a critical concentration (Co) to well above a critical concentration ($CoF_2$). Deposition of aluminum and copper by magnetron sputtering in fluorocarbon/argon plasmas showed that by changing power input the amount of metal in the fluoropolymer/metal films could be controlled (*Nucl. Inst.. Meth.* 212 (1983) 497).

The invention meets a long-felt need in the art by providing system and method for reactive sputter depositing transparent crystalline Cr/C/F thin films onto selected substrate materials using a Cr sputter target and an argon-fluorocarbon (Ar/$C_2F_6$) plasma. Film composition was in the (atom percent) range of (35–55)Cr, (20–45)F, and (20–25)C, and was reproducible through selective control of the Ar/$C_2F_6$ ratio in the feed gas. Substrate material did not affect composition of the deposited films. The films were optically transparent and were determined by electron diffraction to be crystalline. Binding energies of the Cr, C and F species in the films were shown by x-ray photoelectron spectroscopy (XPS) to be of the Cr-F and C-C type.

It is therefore a principal object of the invention to provide system and method for synthesis and deposition of Cr/C/F films.

It is a further object of the invention to provide system and method for plasma assisted deposition of films of Cr/C/F material.

It is another object of the invention to provide system and method for synthesis and deposition of optically transparent, crystalline Cr/C/F.

These and other objects of the invention will become apparent as a detailed description of representative embodiments proceeds.

SUMMARY OF THE INVENTION

In accordance with the foregoing principles and objects of the invention, system and method for plasma-assisted deposition of optically transparent, crystalline chromium/carbon/ fluorine films are described using a chromium metal source and an argon/fluorocarbon plasma. The films were optically transparent to the unaided eye. Characterization of the material by electron diffraction showed the chromium/ carbon/fluorine material to be crystalline.

DESCRIPTION OF THE DRAWINGS

The invention will be more clearly understood from the following detailed description of representative embodiments thereof read in conjunction with the accompanying drawings wherein.

DETAILED DESCRIPTION

Deposition of Cr/C/F thin films according to the principal teachings of the invention is described in O'Keefe et al, "Reactive Sputter Deposition of Crystalline Cr/C/F Thin Films", *Materials Letters* 18 (1994) 251–256, the entire teachings of which are incorporated herein by reference.

Figure 1:
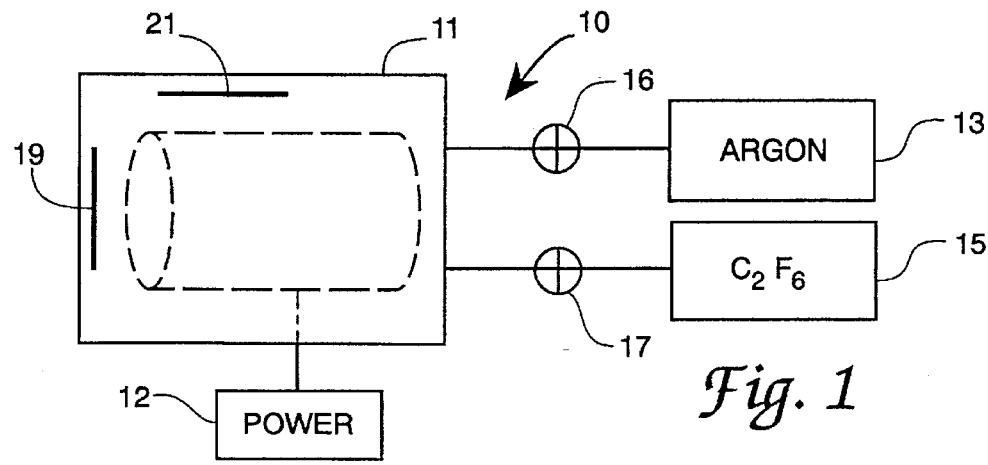
FIG. 1 is a schematic of a representative system for practicing the invention.
Figure 2A:
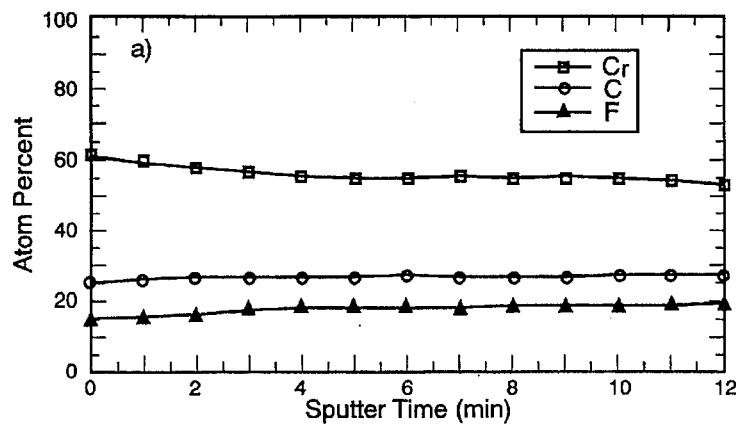
FIGS. 2a,2b,2c show Auger depth profiles for Cr/C/F films deposited onto Corning 7059 glass using Ar:$C_2F_6$ feed gas ratios of 1000: 1,200:1 and 100: 1, respectively.
Figure 2B:
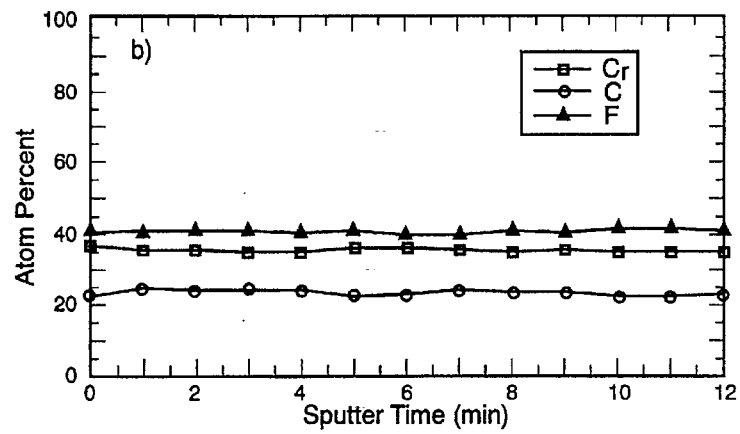
Figure 2C:
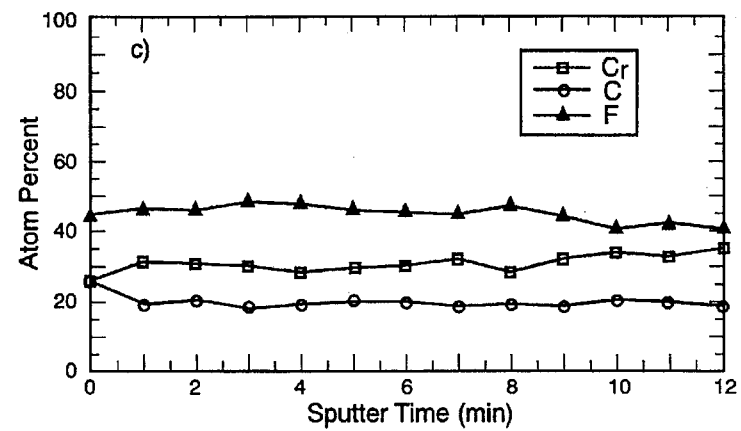

Referring now to the drawings, FIG. 1 is a schematic of a representative system 10 for practicing the invention and which was used in demonstration thereof. Demonstration system 10 comprised sputtering chamber 11 operatively connected to power supply 12, source 13 of argon (Ar) (99.999%, Linde Corp.) and source 15 of hexafluoroethane ($C_2F_6$) (99.95%, Linde) as suggested in FIG. 1. Sputtering chamber 11 comprised a commercial parallel plate, capacitively coupled rf sputtering system (13.56 Mhz; Materials Research Corp.). Base pressure within chamber 11 was $2\times10^{-7}$ torr and the working pressure during depositions was maintained at about $10^{-2}$ torr. All depositions were made at 100 watts power for one hour. Ar and $C_2F_6$ flows were regulated using mass flow controllers 16,17 (Unit Systems Corp.). Demonstration depositions using system 10 were performed at Ar flow rates of either 100 or 200 sccm and $C_2F_6$ flow rates selected between 0.2 and 1.0 sccm in order to provide $Ar:C_2F_6$ ratios between 100:1 and 1000:1. Sputter target 19 within chamber 11 for demonstration depositions was a 50 mm diameter by 1.5 mm thick 99.95% Cr disk (Johnson Matthey Co.), thoroughly cleaned prior to Cr/C/F deposition. Substrate 21 material is not considered limiting of the invention because composition of deposited films was found not to be affected by substrate material. Materials used in demonstration of the invention included polytetrafluoroethylene (PTFE), Corning 7059 glass, low carbon steel, and holey carbon TEM support films. Film thicknesses were measured using a Dektak 3030 surface profilometer. Chemical composition of the deposited films was measured by Auger spectroscopy (Perkin Elmer Phi 660 scanning Auger microprobe operated at 3 keV and 100 nA beam current). FIGS. 2a,2b,2c show Auger depth profiles. for 200 nm Cr/C/F films on Corning 7059 glass substrates using $Ar:C_2F_6$ feed gas ratios of, respectively, 1000:1, 200:1 and 100:1. The 1000:1 feed gas ratio of FIG. 2a resulted in film compositions. (atom percent) of about 55Cr-27C-18F; the 200:1 and 100:1 feed gas ratios resulted in nominal compositions of about 35Cr-(20–25)C-(40–45)F. For the demonstration depositions generally, Cr and F concentrations in the films were sensitive to the feed gas ratio but C concentration remained substantially constant in the 20–25 range.

Figure 3:
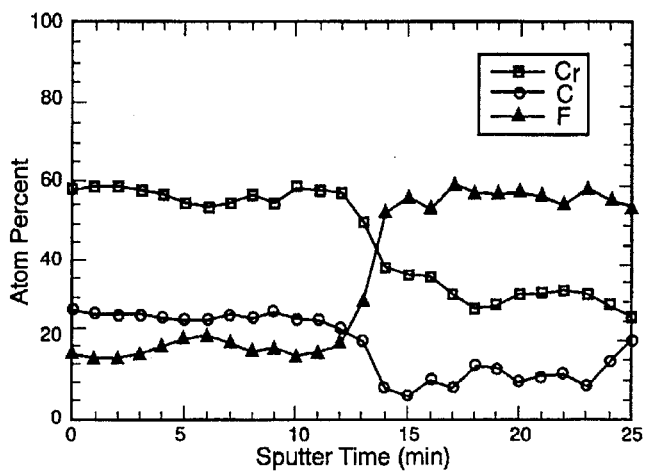
FIG. 3 shows an Auger depth profile for a Cr/C/F film deposited onto Corning 7059 glass using an Ar:$C_2F_6$ feed gas ratio of 70:1 for a sputter time of 13–25 minutes and 1000:1for 0–12 minutes.

Referring now to FIG. 3, shown therein is an Auger depth profile for a 100 nm thick Cr/C,/F film deposited onto a 7059 glass substrate using an $Ar:C_2F_6$ feed gas ratio of about 70:1 (partially poisoned target) for a sputter time of 13–25 minutes and changed to 1000:1 for 0–12 minutes during the deposition. A significant change in composition occurred when the gas feed ratio was changed from 70:1 in the first 50 nm of deposited film (13–25 rain Auger sputter time) to 1000:1 (0–12 min Auger sputter time) in the last 50 nm of deposited film. FIGS. 2a,2b,2c,3 comparison shows that for high $Ar:C_2F_6$ ratios, the films are consistently Cr rich while for lower ratios the films are F rich. Reproducible film composition was achieved by selective control of feed gas ratio. Both C rich and F rich films 25 to 600 nm thick were optically transparent on 7059 glass substrates.

Figure 4A:
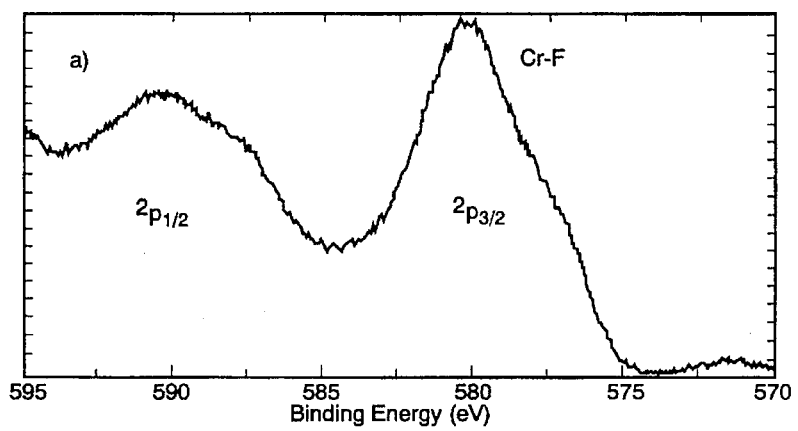
FIGS. 4a,4b,4c show XPS spectra from a 35Cr-25C-45F thin film on Corning 7059 glass for the chromium 2p, carbon 1s and flourine 1s photoelectrons, respectively.
Figure 4B:
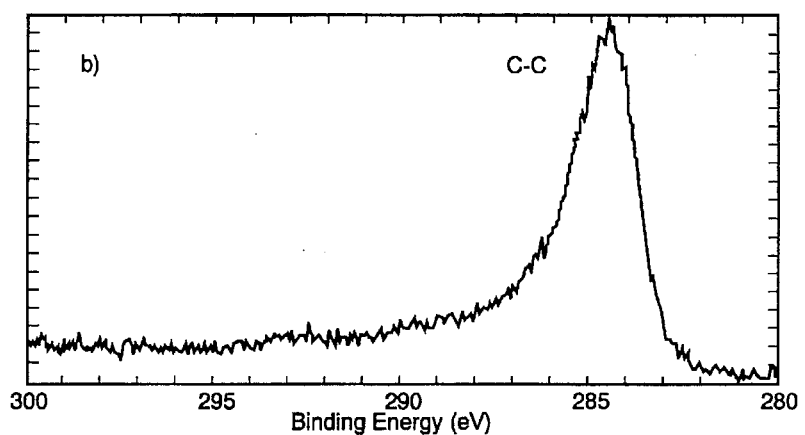
Figure 4C:
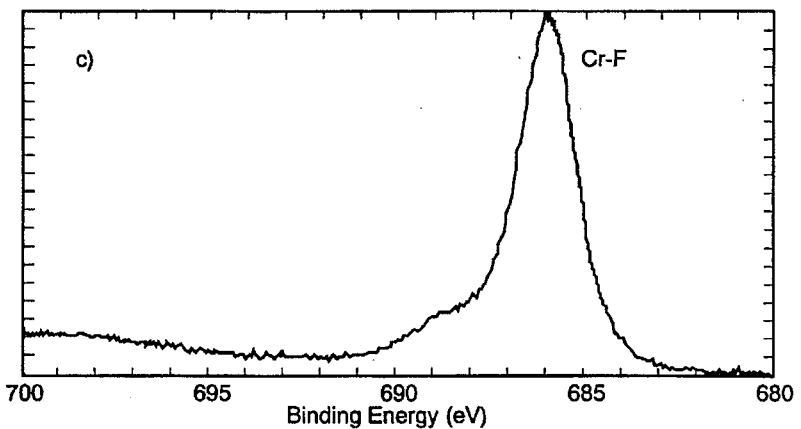

FIGs. 4a,4b,4C show XPS spectra (Perkin Elmer Phi 5400 system with Mg-Kα radiation at a take-off angle of 45°) from a 35Cr-25C-45F film on glass for the Cr 2p, C ls and F ls photoelectrons, respectively. FIG. 4a shows the dominant Cr $2p_{3/2}$ binding energy to be 580 eV, which is closer to the theoretical binding energy of $CrF_3$ (580.5 eV) (Carver et al, *J. Chem. Phys.* 57 (2) (15 Jul. 1972) 973) than either pure Cr (574.4 eV) or chromium carbides (~577 eV) (*Handbook of X-ray Photo-electron Spectroscopy* Muilenberg, ed (Perkin-Elmer Corp, 1992). FIG. 4c shows the binding energy of the F atoms to be 686 eV which indicates a transition metal-fluoride complex such as Cr-F. FIG 4b shows the carbon 1s binding energy to be dominated by C-C type bonding at 284.5 eV which matched a thin film carbon standard that was fabricated using a 99.9% C graphite target and pure argon plasma in system 10. The XPS data show the Cr/C/F films to be dominated by Cr-F and C-C bonding. That the carbon in the film is not reacting with either the Cr or F explains the Auger results in FIGS. 2a,b,c in which the C concentration in the films was insensitive to the $Ar/C_2F_6$ ratio in the feed gas but the Cr and F were affected by the $Ar:C_2F_6$ ratio. XPS results from Cr/C/F films deposited on PTFE and steel substrates were identical to the spectra in FIGS. 4a,b,c. Collectively, the Auger and XPS results indicate that Cr-F interactions dominated the nucleation and growth mechanism of Cr/C/F films regardless of substrate material.

Film morphology by SEM (Hitachi S-800 SEM operated at 20 kV) of deposited Cr/C/F films on 7059 glass substrates was examined after the glass was scribed and broken in order to view the microstructure of the films. Both the high Cr content films and the high F concentration films exhibited a uniformly small, fine grain size microstructure with a slightly columnar structure. No evidence of voids or pinholes in the structures, and no elemental segregation or hillock formation was observed.

Figure 5:
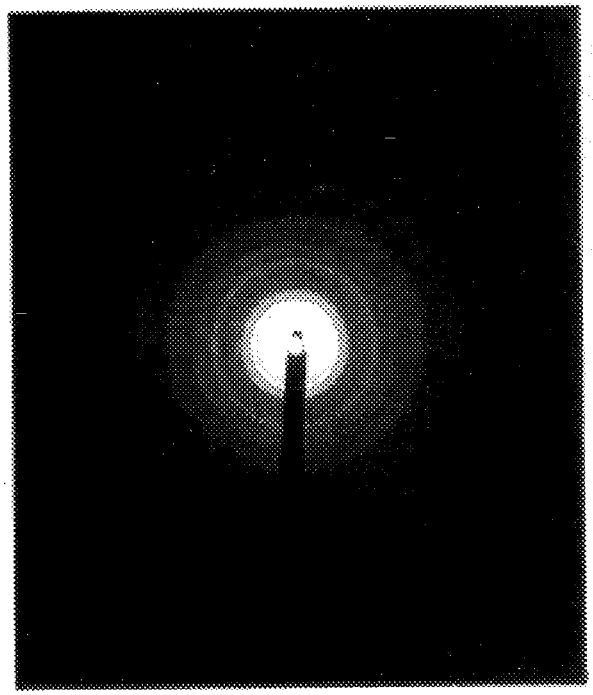
FIG. 5 is an electron diffraction pattern from a 25 nm thick Cr/C/F film on a holey carbon TEM support film.
Figure 6:
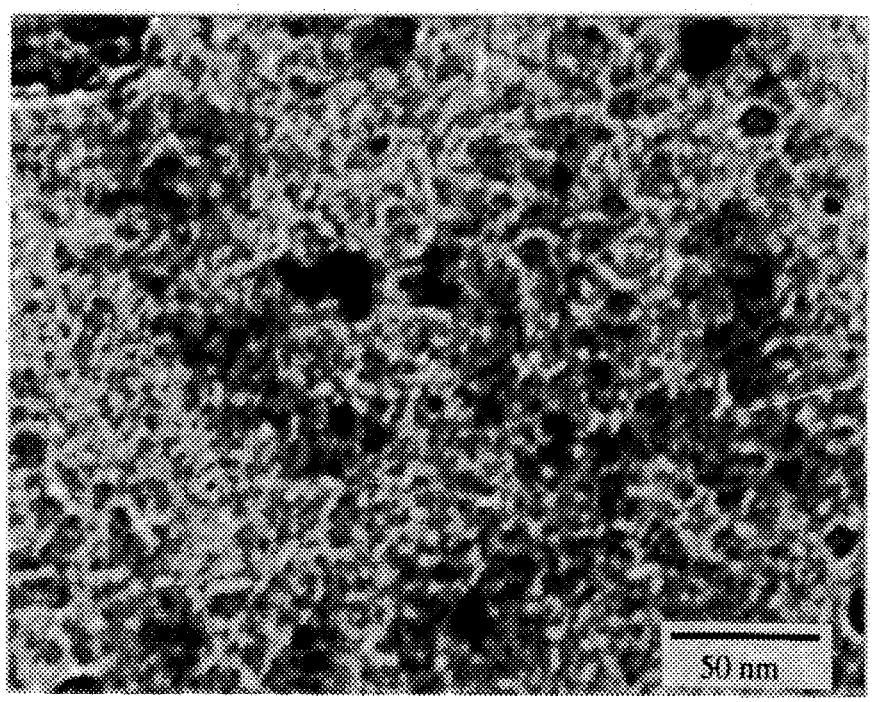
FIG. 6 is bright field TEM micrograph from a Cr/C/F film on a holey carbon support film.

Microstructural characterization (Philips 400T TEM operated at 120 kV) of 25 nm thick Cr/C/F film depositions on TEM holey carbon support films showed the films to be crystalline, as evidenced by the electron diffraction ring pattern of FIG. 5, rather than amorphous or glassy as might have been expected. Sharpness and clarity of the FIG. 5 pattern precludes any significant percentage of non-crystalline structure in the films. The d-spacings for the innermost 15 rings in the diffraction pattern are listed in Table I. Comparison of the d-spacings for these films with the d-spacings for crystal structures of Cr, Cr-C, and Cr-F did not match any known crystal structure listed in powder diffraction files of the Joint Committee on Powder Diffraction Standards. A bright field micrograph from a Cr/C/F film (FIG. 6) indicates that the grain size of the films is on the order of 10–50 nm. The difffacting grains appear as dark regions in FIG. 6, further evidencing the crystalline nature of the films.

TABLE I

| Ring # | d-spacing (Å) |
|---|---|
| 1 | 3.33 |
| 2 | 2.87 |
| 3 | 2.80 |
| 4 | 2.66 |
| 5 | 2.47 |
| 6 | 2.32 |
| 7 | 2.30 |
| 8 | 2.07 |
| 9 | 1.88 |
| 10 | 1.85 |
| 11 | 1.76 |
| 12 | 1.73 |
| 13 | 1.66 |
| 14 | 1.59 |
| 15 | 1.49 |

The invention therefore provides system and method for deposition of optically transparent crystalline chromium/carbon/fluorine films. It is understood that modifications to the invention may be made as might occur to one skilled in the field of the invention within the scope of the appended claims. All embodiments contemplated hereunder which achieve the objects of the invention have therefore not been shown in complete detail. Other embodiments may be developed without departing from the spirit of the invention or from the scope of the appended claims.

We claim:

1. A method for sputter deposition of a crystalline film of chromium, carbon and fluorine, comprising the steps of:
    (a) providing a sputtering chamber and a chromium sputter target and substrate disposed therein;
    (b) providing a source of argon;
    (c) providing a source of hexafluoroethane;
    (d) flowing argon from said source of argon at a flow rate of 100 to 200 sccm and flowing hexaflouroethane at a flow rate of 0.2 to 1.0 sccm whereby the ratio of the argon flow rate to the hexafluoroethane flow is the range of 100:1 to 1000:1; and (e) sputtering said chromium from said target to said substrate under said flow rates of said argon and said hexafluoroethane.

2. The method of claim 1 wherein a pressure within said sputtering chamber during said sputtering step is maintained at about $10^{-2}$ torr.

3. The method of claim 1 wherein said substrate comprises a material selected from the group consisting of polytetrafluoroethylene, glass, carbon steel, and carbon grids.

4. A crystalline chromium, carbon and fluorine film made by the method of claim 1.

* * * * *